US009111751B2

(12) United States Patent
Furukawa et al.

(10) Patent No.: US 9,111,751 B2
(45) Date of Patent: Aug. 18, 2015

(54) SILICON CARBIDE SEMICONDUCTOR DEVICE AND METHOD OF FABRICATING SAME

(75) Inventors: Akihiko Furukawa, Tokyo (JP); Yasuhiro Kagawa, Tokyo (JP); Naruhisa Miura, Tokyo (JP); Masayuki Imaizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 231 days.

(21) Appl. No.: 13/995,993

(22) PCT Filed: May 18, 2011

(86) PCT No.: PCT/JP2011/002773
§ 371 (c)(1), (2), (4) Date: Sep. 3, 2013

(87) PCT Pub. No.: WO2012/086099
PCT Pub. Date: Jun. 28, 2012

(65) Prior Publication Data

US 2014/0001472 A1 Jan. 2, 2014

(30) Foreign Application Priority Data

Dec. 21, 2010 (JP) ................................ 2010-284663

(51) Int. Cl.
*H01L 23/58* (2006.01)
*H01L 21/02* (2006.01)
(Continued)

(52) U.S. Cl.
CPC ...... *H01L 21/02529* (2013.01); *H01L 21/8213* (2013.01); *H01L 27/0629* (2013.01);
(Continued)

(58) Field of Classification Search
CPC ................ H01L 2924/00; H01L 2924/00014; H01L 2924/12032; H01L 29/1608; H01L 29/872; H01L 29/2003; H01L 2924/1305; H01L 2924/13091; H01L 29/0619; H01L 29/66143; H01L 29/66462; H01L 29/6606
See application file for complete search history.

(56) References Cited

U.S. PATENT DOCUMENTS

2003/0042538 A1 3/2003 Kumar et al.
2005/0012143 A1 1/2005 Tanaka et al.
2006/0076613 A1 4/2006 Ohyanagi et al.

FOREIGN PATENT DOCUMENTS

JP 6 310725 11/1994
JP 8 18075 1/1996

(Continued)

OTHER PUBLICATIONS

International Search Report Issued Jul. 26, 2011 in PCT/JP11/002773 Filed May 18, 2011.

(Continued)

*Primary Examiner* — Robert Bachner
(74) *Attorney, Agent, or Firm* — Oblon, McClelland, Maier & Neustadt, L.L.P.

(57) ABSTRACT

A silicon carbide semiconductor device including an SBD measuring a temperature of a silicon carbide semiconductor element. The silicon carbide semiconductor device includes a MOSFET formed on a silicon carbide epitaxial substrate, and an SBD section measuring a temperature of the MOSFET. The SBD section includes an n-type cathode region in a surface portion of a silicon carbide drift layer; an anode titanium electrode formed on the cathode region, the electrode serving as a Schottky electrode; an n-type cathode contact region of a higher concentration than that of the cathode region, formed in the surface portion of the silicon carbide drift layer to make contact with the cathode region; a cathode ohmic electrode formed on the cathode contact region; and a first p-type well region formed within the silicon carbide drift layer to surround peripheries of the cathode region and the cathode contact region.

6 Claims, 12 Drawing Sheets

(51) Int. Cl.

| | |
|---|---|
| ***H01L 21/82*** | (2006.01) |
| ***H01L 27/06*** | (2006.01) |
| ***H01L 29/66*** | (2006.01) |
| ***H01L 29/78*** | (2006.01) |
| ***H01L 29/872*** | (2006.01) |
| ***H01L 29/47*** | (2006.01) |
| *H01L 29/16* | (2006.01) |
| *H01L 29/45* | (2006.01) |
| *H01L 29/06* | (2006.01) |

(52) U.S. Cl.

CPC ............ *H01L29/47* (2013.01); *H01L 29/6606* (2013.01); *H01L 29/66068* (2013.01); *H01L 29/7802* (2013.01); *H01L 29/7828* (2013.01); *H01L 29/872* (2013.01); *H01L 29/0619* (2013.01); *H01L 29/0692* (2013.01); *H01L 29/1608* (2013.01); *H01L 29/45* (2013.01)

(56) References Cited

FOREIGN PATENT DOCUMENTS

| | | |
|---|---|---|
| JP | 2003 68759 | 3/2003 |
| JP | 2003 188370 | 7/2003 |
| JP | 2005 175357 | 6/2005 |
| JP | 2005 209710 | 8/2005 |
| JP | 2006 93382 | 4/2006 |
| JP | 2007 134684 | 5/2007 |
| JP | 2008 103537 | 5/2008 |

OTHER PUBLICATIONS

U.S. Appl. No. 13/992,574, filed Jun. 7, 2013, Kagawa, et al.

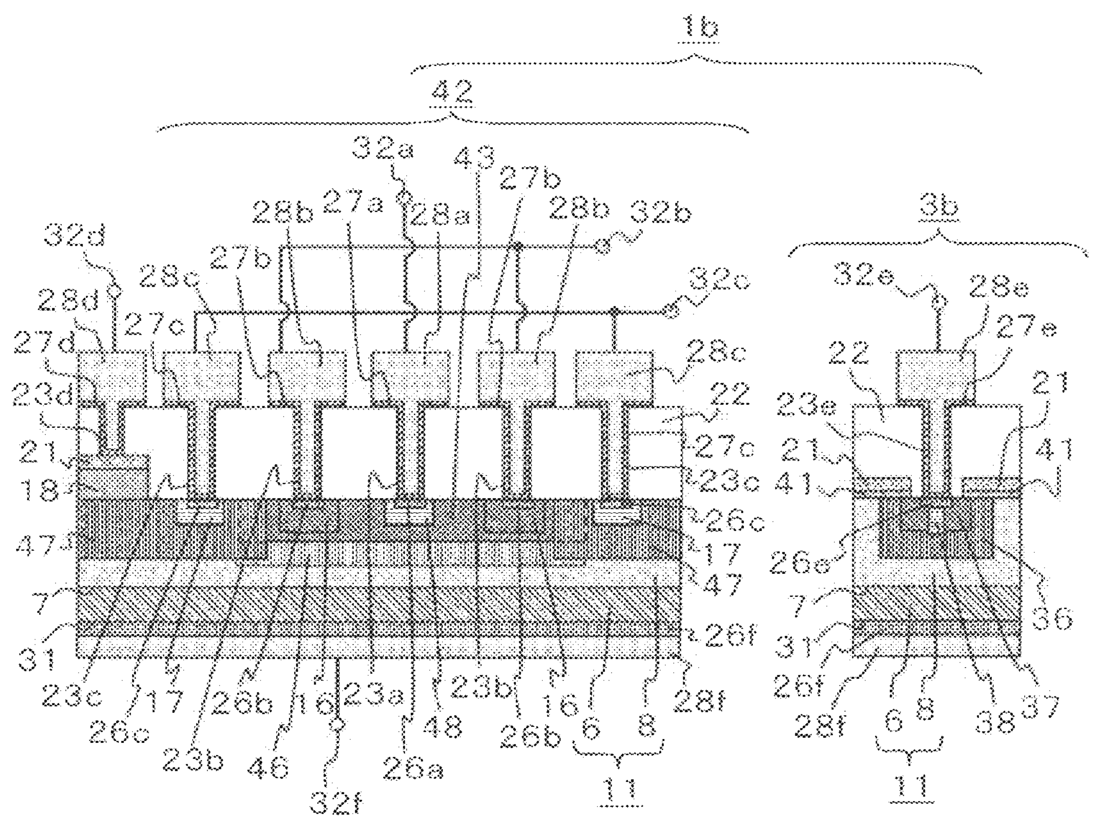
FIG. 17A
FIG. 17B
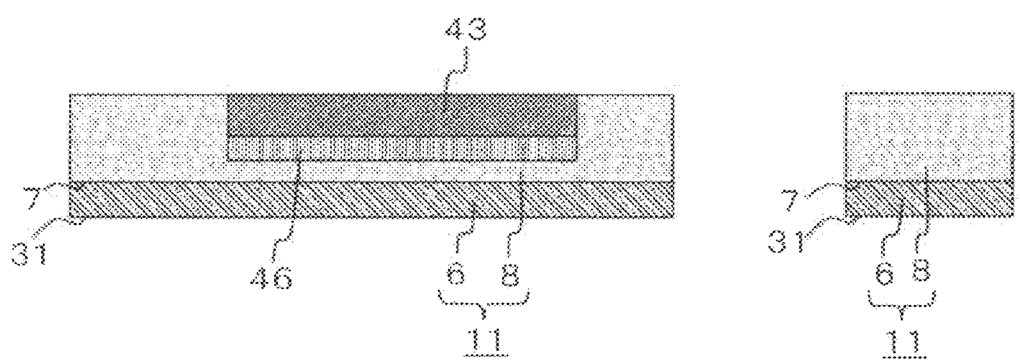
FIG. 18A
FIG. 18B

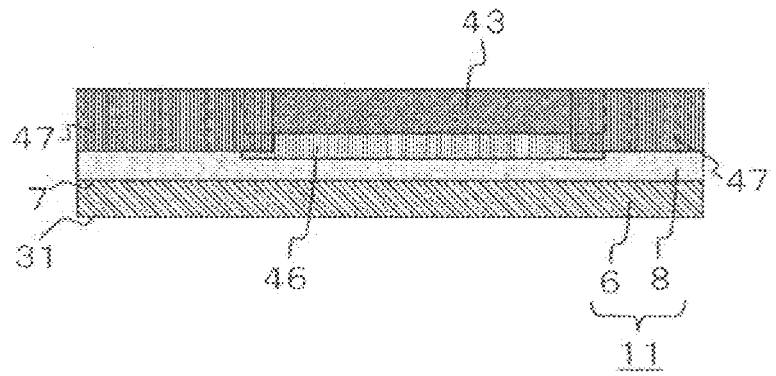
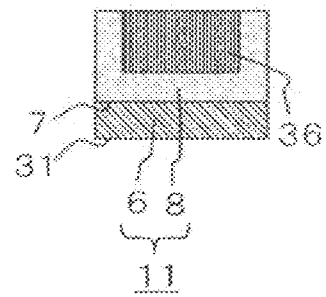
FIG. 19A
FIG. 19B
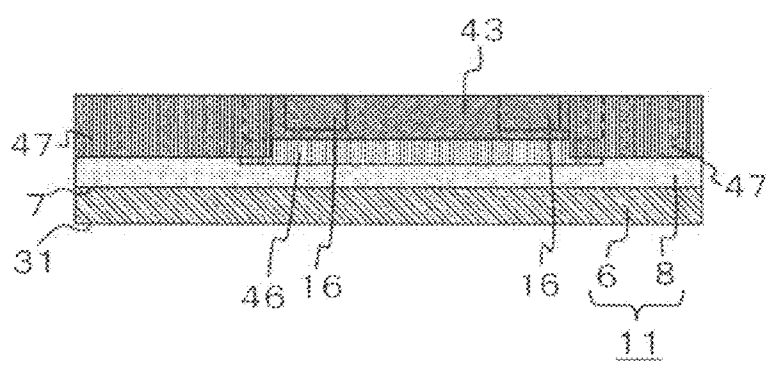
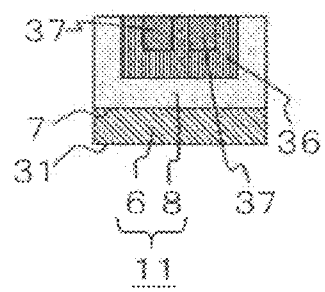
FIG. 20A
FIG. 20B

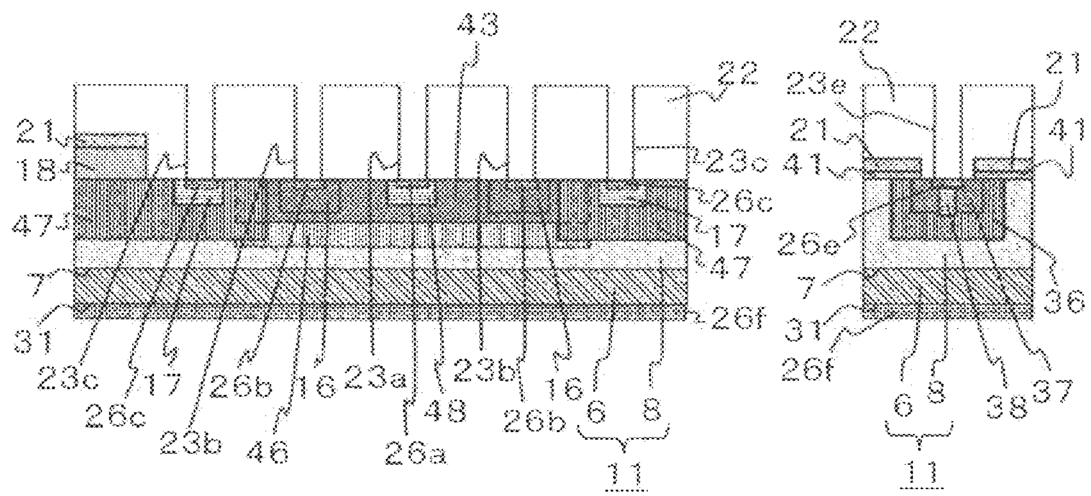
FIG. 23A
FIG. 23B
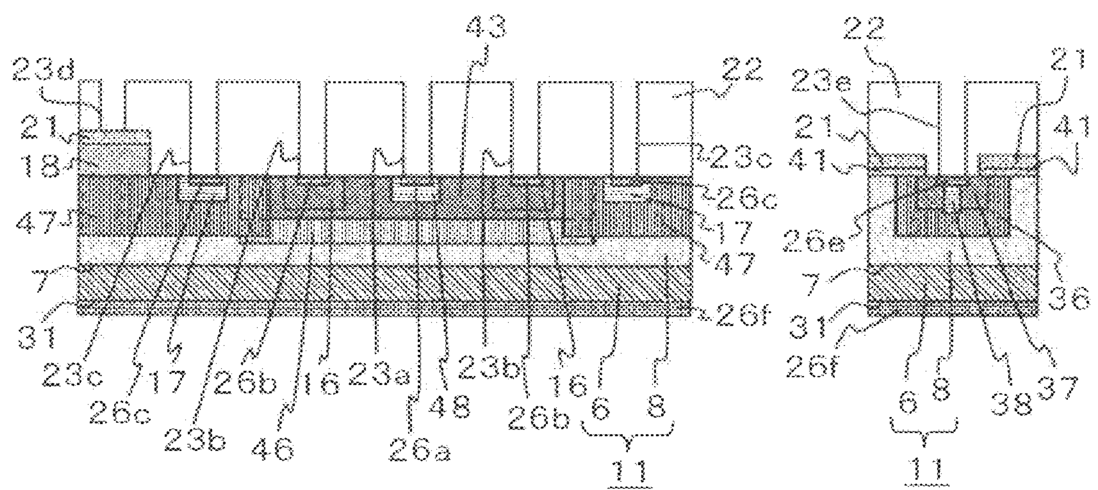
FIG. 24A
FIG. 24B

SILICON CARBIDE SEMICONDUCTOR DEVICE AND METHOD OF FABRICATING SAME

TECHNICAL FIELD

The present invention relates to silicon carbide semiconductor devices that include diodes for measuring temperatures of silicon carbide semiconductor elements.

BACKGROUND ART

Silicon carbide (SiC) semiconductor elements are operable at a higher temperature as compared with semiconductor elements formed of silicon (Si). However, since the operable temperature has an upper limit, it is preferable to equip the semiconductor devices with temperature sensors for measuring temperatures of the semiconductor elements.

An example of an SiC semiconductor device equipped with a temperature sensor includes an device described in Patent Document 1. Patent Document 1 discloses that a pn junction diode, hetero junction diode, or Schottky diode (hereinafter called "SBD") is formed on the same substrate as a static induction transistor formed of SiC, to use such a diode as the temperature sensor for measuring a temperature of the static induction transistor.

RELATED ART REFERENCE

Patent Document

Patent Document 1 JP-A-2006-93382 (pages 2 through 8, and FIGS. 1 through 4)

SUMMARY OF INVENTION

Problem that the Invention is to Solve

A problem, however, is that Patent Document 1 has not described a specific configuration of, and a method of fabricating, an SiC semiconductor device equipped with the SBD for use as a temperature sensor that measures a temperature of an SiC semiconductor element.

The present invention is directed to overcome the above problem, and an object of the invention is to provide an SiC semiconductor device equipped with an SBD for measuring a temperature of an SiC semiconductor element.

Means for Solving the Problem

An SiC semiconductor device according to the present invention comprises an SiC epitaxial substrate having an n-type SiC substrate, and an n-type SiC drift layer formed on a surface of the SiC substrate; an SiC semiconductor element formed on the SiC epitaxial substrate; and a Schottky diode formed on the SiC epitaxial substrate, for measuring a temperature of the SiC semiconductor element. The Schottky diode includes an n-type cathode region in a surface portion of the SiC drift layer; a first titanium electrode formed on the cathode region, the first titanium electrode serving as a Schottky electrode; an n-type cathode contact region formed in the surface portion of the SiC drift layer so as to make contact with the cathode region, the cathode contact region having a higher concentration than the cathode region; a first ohmic electrode formed on the cathode contact region; and a first p-type well region formed so as to surround peripheries of the cathode region and the cathode contact region within the SiC drift layer.

Further, a method of fabricating the SiC semiconductor device according to the present invention is that of fabricating an SiC semiconductor device that includes an SiC epitaxial substrate having an n-type SiC substrate, and an n-type SiC drift layer formed on a surface of the n-type SiC substrate; an SiC semiconductor element formed on the SiC epitaxial substrate; and a Schottky diode formed on the SiC epitaxial substrate, for measuring a temperature of the SiC semiconductor element. The method of fabricating the SiC semiconductor device comprises, in order to form the Schottky diode, the steps of forming a first p-type well region formed so as to surround a periphery of an n-type cathode region in a surface portion of the SiC drift layer within the SiC drift layer; forming an n-type cathode contact region in the surface portion of the SiC drift layer and within a region surrounded by the first well so that the n-type cathode contact region makes contact with the cathode region, the cathode contact region having a higher concentration than the cathode region; forming a first ohmic electrode on the cathode contact region; and forming a first titanium electrode on the cathode region, the first titanium electrode serving as a Schottky electrode.

Advantageous Effects of the Invention

The present invention can provide an SiC semiconductor device that is equipped with an SBD for measuring a temperature of an SiC semiconductor element.

Further, according to a method of fabricating the SiC semiconductor device of the present invention, an SiC semiconductor device can be provided that is equipped with the SBD for measuring a temperature of an SiC semiconductor element.

BRIEF DESCRIPTION OF DRAWINGS

FIG. 1 is a set of cross-sectional views illustrating an SiC semiconductor device 1*a* according to Embodiment 1 of the present invention;

FIG. 17 is a set of cross-sectional views illustrating an SiC semiconductor device according to Embodiment 2 of the present invention;

FIG. 17A is a cross-sectional view showing a pn junction diode section and its neighborhood, and FIG. 17B, a cross-sectional view showing a MOSFET section;

FIG. 18 is a set of cross-sectional views partially illustrating a method of fabricating a SiC semiconductor device according to Embodiment 2 of the present invention;

FIG. 19 is a set of cross-sectional views partially illustrating the method of fabricating the SiC semiconductor device according to Embodiment 2 of the present invention;

FIG. 20 is a set of cross-sectional views partially illustrating the method of fabricating the SiC semiconductor device according to Embodiment 2 of the present invention;

FIG. 23 is a set of cross-sectional views partially illustrating the method of fabricating the SiC semiconductor device according to Embodiment 2 of the present invention;

FIG. 24 is a set of cross-sectional views partially illustrating the method of fabricating the SiC semiconductor device according to Embodiment 2 of the present invention.

MODE FOR CARRYING OUT THE INVENTION

Embodiment 1

Figures 1A, 1B:
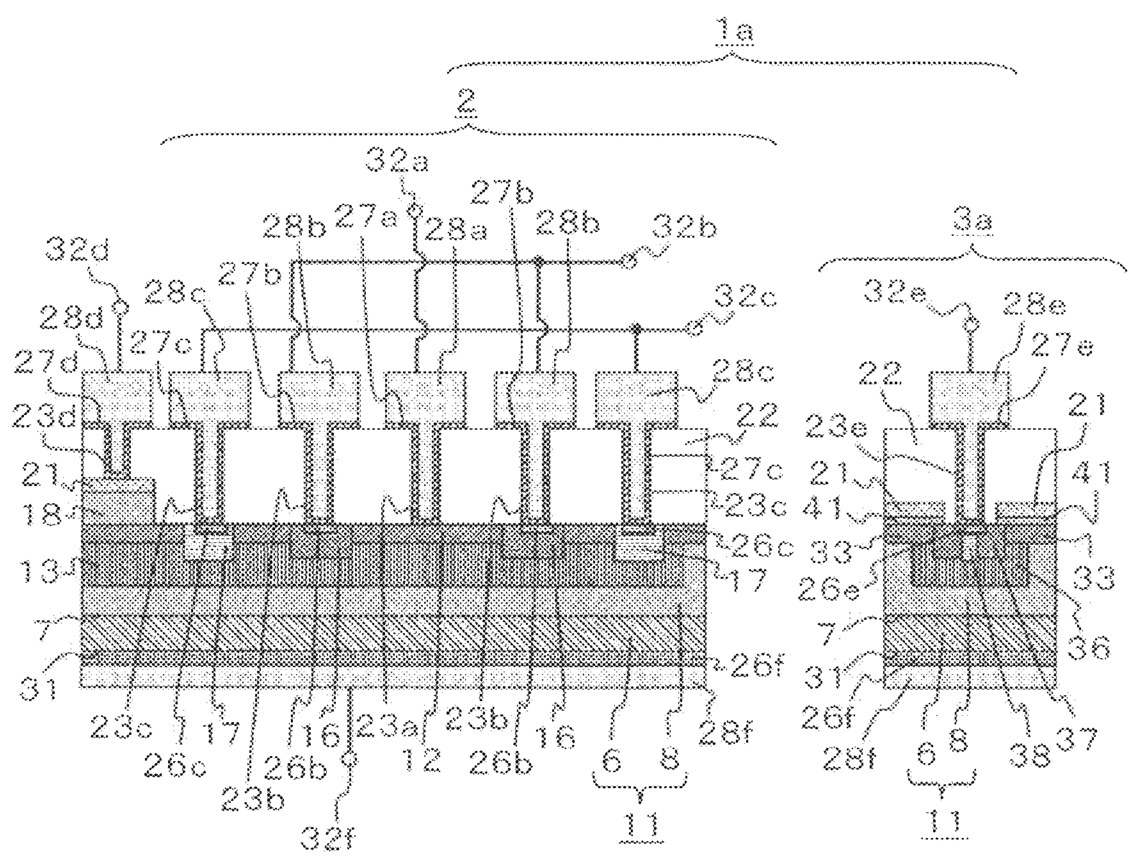
FIG. 1A is a cross-sectional view showing an SBD section 2 and its neighborhood, and FIG. 1B, a cross-sectional view showing a MOSFET section 3*a;*
Figure 2:
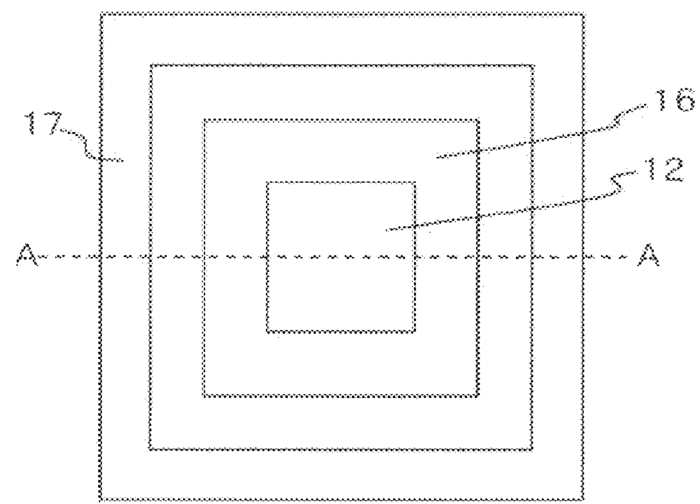
FIG. 2 is a plan view illustrating an enlarged neighborhood of the SBD section of an SiC epitaxial substrate according to Embodiment 1 of the present invention.

A silicon carbide (SiC) semiconductor device 1*a* according to Embodiment 1 of the present invention will be described first. FIG. 1 is a set of cross-sectional views illustrating an SiC semiconductor device 1*a* according to Embodiment 1 of the present invention; FIG. 1A is a cross-sectional view showing a neighborhood of an SBD section 2; and FIG. 1B, a cross-sectional view showing a MOSFET section 3*a*. FIG. 2 is a plan view illustrating an enlarged neighborhood of the SBD section 2 of an SiC epitaxial substrate 11 according to Embodiment 1 of the present invention. Note that FIG. 1 shows the SiC semiconductor device 1*a* taken along the same cross-section as A-A cross-section in FIG. 2.

Referring now to FIG. 1, the SiC semiconductor device 1*a* includes the MOSFET section 3*a*—where a metal oxide semiconductor field effect transistor (MOSFET), which is an SiC semiconductor element, is formed on the SiC epitaxial substrate 11 where an n-type SiC drift layer 8 is formed on a surface 7 of the n-type SiC substrate 6—and the SBD section 2 where an SBD for measuring a temperature of the MOSFET is formed. Note that although FIG. 1 separately shows the SBD section 2 and the MOSFET section 3*a*, both of them are actually formed on the same SiC epitaxial substrate 11.

The configurations of the SBD section 2 and its neighborhood will be described first. The SBD section 2 has an n-type cathode region 12 formed in the surface portion of the SiC drift layer 8, and has a first p-type well region 13 formed in a portion deeper than the cathode region 12 of the SiC drift layer 8, as shown in FIG. 1A. Further, an n-type cathode contact region 16 having a higher concentration than the cathode region 12 is formed so that the cathode contact region 16 in the surface portion of the SiC drift layer 8 surrounds an outer circumference of the cathode region 12, as shown in FIG. 1A and FIG. 2. Then, a p-type guard region 17 having a higher concentration than the first well region 13 is formed so that the guard region 17 in the surface portion of the SiC drift layer 8 surrounds an outer circumference of the cathode contact region 16. The cathode region 12 adjoins the cathode contact region 16, and peripheries of both regions are surrounded by a p-region formed by the first p-type well region 13 having a less concentration than the guard region 17 and the guard region 17, within the SiC drift layer 8.

A field oxide film 18 covers over a region of the SiC drift layer 8 other than those where elements are formed, and formed on the field oxide film 18 is a polysilicon electrode 21 that serves as a gate electrode. An inter-layer dielectric film 22 is formed above the SiC drift layer 8 and the polysilicon electrode 21, and an anode contact hole 23*a*, a cathode contact hole 23*b*, a guard contact hole 23*c*, and a gate contact hole 23*d* are formed on the cathode region 12, the cathode contact region 16, the guard region 17, and the polysilicon electrode 21, respectively.

Then, a cathode ohmic electrode 26*b* is formed, on the cathode contact region 16, in a portion corresponding to a bottom of the cathode contact hole 23*b*; and a guard ohmic electrode 26*c*, on the guard region 17, in a portion corresponding to a bottom of the guard contact hole 23*c*.

Moreover, an anode titanium electrode 27*a* is formed so as to make contact with the cathode region 12 and to cover an inner surface of the anode contact hole 23*a*; a cathode titanium electrode 27*b* is formed so as to make contact with the cathode ohmic electrode 26*b* and to cover an inner surface of the cathode contact hole 23*b*; a guard titanium electrode 27*c* is formed so as to make contact with the guard ohmic electrode 26*c* and to cover an inner surface of the guard contact hole 23*c*; and a gate titanium electrode 27*d* is formed so as to make contact with the polysilicon electrode 21 and to cover an inner surface of the gate contact hole 23*d*. Note that the anode titanium electrode 27*a* is a Schottky electrode that forms a Schottky barrier between the anode titanium electrode 27*a* and cathode region 12.

In addition, an anode wiring 28*a* is formed so as to make contact with the anode titanium electrode 27*a* and to fill in the anode contact hole 23*a*; a cathode wiring 28*b* is formed so as to make contact with the cathode titanium electrode 27*b* and to fill in the cathode contact hole 23*b*; a guard wiring 28*c* is formed so as to make contact with the guarde titanium electrode 27c and to fill in the guarde contact hole 23c; and a gate wiring 28d is formed so as to make contact with the gate titanium electrode 27d and to fill in the gate contact hole 23d.

Further, a drain ohmic electrode 26f is formed on the other surface 31 of the SiC substrate 6, and a drain wiring 28f is formed on the drain ohmic electrode 26f.

Then, an anode terminal 32a is connected to the anode wiring 28a; a cathode terminal 32b, to the cathode wiring 28b; a guard terminal 32c, to the guard wiring 28c; and a drain terminal 32f, to the drain wiring 28f.

The configuration of the MOSFET section 3a will be described next. The MOSFET section 3a has an n-type embedded channel region 33 formed in the surface portion of the SiC drift layer 8, as shown in FIG. 1B. In addition, a second p-type well region 36, having substantially the same concentration as that of the first well region 13, is formed in contact with, and in a portion deeper than, the embedded channel region 33 of the SiC drift layer 8. Moreover, an n-type source region 37 of substantially the same concentration as that of the cathode contact region 16 is formed in the surface portion of the SiC drift layer 8 so as to range from the embedded channel region 33 to the second well region 36. Further, a p-type well contact region 38 of substantially the same concentration as that of the guard region 17 is formed in the surface portion of the SiC drift layer 8 so as to makes contact with the source region 37 and the second well region 36.

A gate dielectric film 41 is formed above part of the SiC drift layer 8 of the MOSFET section 3a, and the polysilicon electrode 21 serving as the gate electrode is formed on the gate dielectric film 41. The polysilicon electrode 21 is formed astride the source region 37, the second well region 36 and the embedded channel region 33, of the SiC drift layer 8, with the gate dielectric film 41 intervening between the polysilicon electrode 21 and the source region 37, the second well region 36 and the embedded channel region 33. Note that the polysilicon electrode 21 on the gate dielectric film 41, described herein, and the polysilicon electrode 21 on the field oxide film 18, described previously, are formed as a single continuous electrode, both of which are electrically connected together.

Then, the inter-layer dielectric film 22 is formed on the SiC drift layer 8 and on the polysilicon electrode 21, and the source contact hole 23e is formed above the source region 37 and the well contact region 38. A source ohmic electrode 26e is formed on a portion that is on the source region 37 and the well contact region 38 and corresponds to the bottom of a source contact hole 23e. Further, a source titanium electrode 27e is formed so as to make contact with the source ohmic electrode 26e and to cover an inner surface of the source contact hole 23e, and a source wiring 28e is formed so as to make contact with the source titanium electrode 27e and to fill in the source contact hole 23e. A source terminal 32e is connected to the source wiring 28e.

In addition, formed on the other surface 31 of the SiC substrate 6 is the drain ohmic electrode 26f and the drain wiring 28f in the same fashion as in the SBD section 2. Note that the drain ohmic electrodes 26f formed in the SBD section 2 and the MOSFET section 3a are formed into a single continuous electrode, both of which are electrically connected together. This holds true for the drain wiring 28f as well.

A method of fabricating the SiC semiconductor device 1a according to Embodiment 1 will be described next. FIGS. 3 through 14 are cross-sectional views partially illustrating the method of fabricating the SiC semiconductor device 1a according to Embodiment 1 of the present invention. Note that, in each of the drawing numbers, the symbol A depicts the SBD section 2 and its neighborhood and the symbol B, the MOSFET section 3a.

Figure 3A:
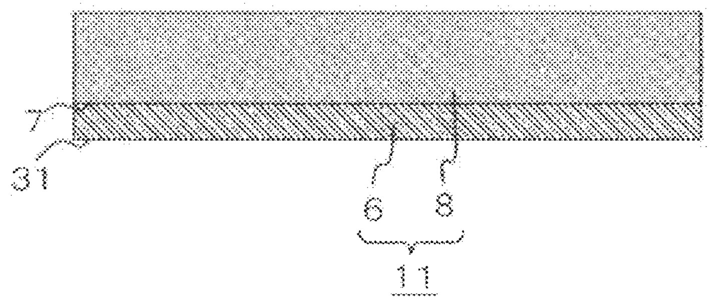
FIG. 3 is a set of cross-sectional views partially illustrating a method of fabricating the SiC semiconductor device according to Embodiment 1 of the present invention.
Figure 3B:
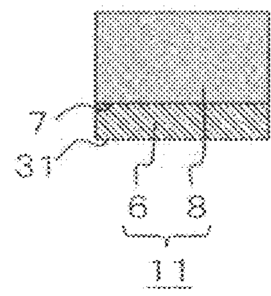

An n-type silicon carbide substrate 6 with low resistance is first made ready and available whose plane orientation of the surface 7 is (0001) plane and the SiC substrate 6 has a 4H poly type. And as shown in FIG. 3, the SiC epitaxial substrate 11 is formed by forming the n-type SiC drift layer 8 with a thickness of 4 μm through 200 μm by a chemical vapor deposition (CVD) technique on the surface 7 of the SiC substrate 6. Here, n-type dopant concentration of the SiC drift layer 8 is determined to within a value range between, for example, $1\times10^{14}$ $cm^{-3}$ and $1\times10^{17}$ $cm^{-3}$. Note that the plane orientation of the SiC substrate 6 may be of (000-1) plane, (11-20) plane or the like and may be slanted below 8 degrees from such a plane orientation. Moreover, the poly type may be of 6H, 3C or the like.

A process of implanting ions into the SiC drift layer 8 will be described below. The ion-implantation is performed using a resist mask formed on the SiC drift layer 8 by photolithography. During the ion-implantation, the SiC epitaxial substrate 11 may be heated at 200° C. through 800° C., or alternatively, does not need to be heated actively. For an n-type dopant for ion-implantation, a substance such as nitrogen, phosphorus or arsenic is used. For a p-type dopant therefor, a substance such as aluminum, boron or gallium is employed.

Figure 4A:
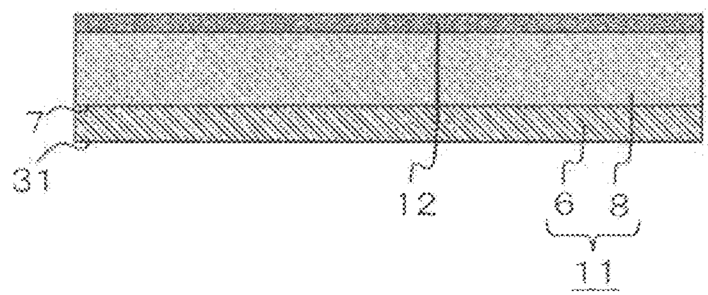
FIG. 4 is a set of cross-sectional views partially illustrating the method of fabricating the SiC semiconductor device according to Embodiment 1 of the present invention.
Figure 4B:
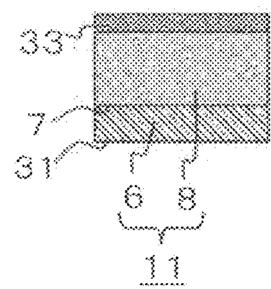

As shown in FIG. 4, the n-type dopant is next ion-implanted from a surface of the SiC drift layer 8, to form the cathode region 12 and the embedded channel region 33 in the surface portion of the SiC drift layer 8. The cathode region 12 and the embedded channel region 33 are of substantially the same dopant concentration, and formed in one and the same ion-implantation process.

The n-type dopant concentration for ion-implantation is set to within a value range between, for example, $1\times10^{15}$ $cm^{-3}$ and $1\times10^{18}$ $cm^{-3}$ so as to exceed a value of the dopant concentration of the SiC drift layer 8 and not to exceed a value of the dopant concentration to be described later of the cathode contact region 16. The depth of ion-implantation is determined to within a value of, for example, 0.4 μm deep from the surface of the SiC drift layer 8. Forming the embedded channel region 33 in the MOSFET section 3a can increase conductivity in the channel region of the MOSFET. Note that the cathode region 12 and the embedded channel region 33 may be formed as a single continuous ion-implantation layer, or alternatively may be formed as separate ion-implantation layers.

Figure 5A:
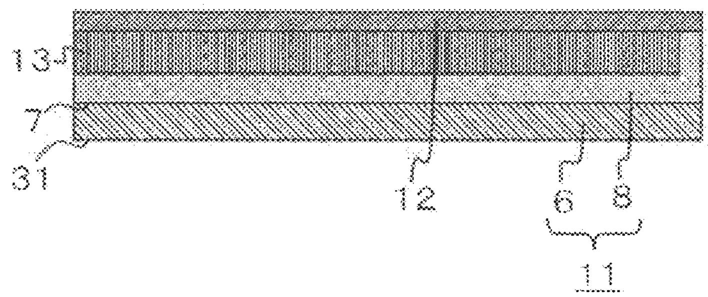
FIG. 5 is a set of cross-sectional views partially illustrating the method of fabricating the SiC semiconductor device according to Embodiment 1 of the present invention.
Figure 5B:
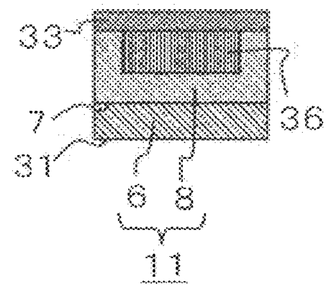

As shown in FIG. 5, the p-type dopant is subsequently ion-implanted from the surface of the SiC drift layer 8, to form the first well region 13 in a portion deeper than and in contact with the cathode region 12, and the second well region 36 in a portion deeper than and in contact with the embedded channel region 33 of the SiC drift layer 8. The first well region 13 and the second well region 36 are of substantially the same dopant concentration, and formed in one and the same ion-implantation process.

The p-type dopant concentration for the ion-implantation exceeds a value of the dopant concentration of the SiC drift layer 8, and is determined to within a value range between, for example, $1\times10^{15}$ $cm^{-3}$ and $1\times10^{19}$ $cm^{-3}$. The depth of ion-implantation is set so that the bottoms of the first well region 13 and the second well region 36 are at a higher position than that of the SiC drift layer 8; the depth thereof is determined to within a value range between, for example, 0.3 μm and 2 μm.

Note that the foregoing process of forming the cathode region 12 and the embedded channel region 33, and the process of forming the first well region 13 and the second well region 36 may be performed in a reverse order.

Figure 6A:
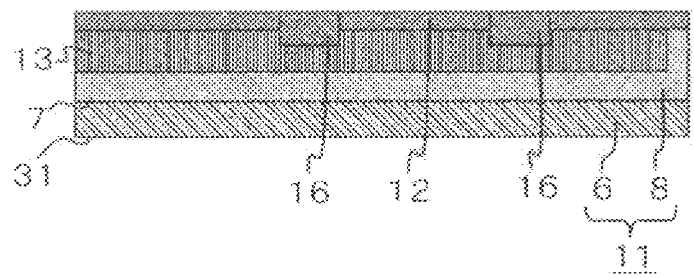
FIG. 6 is a set of cross-sectional views partially illustrating the method of fabricating the SiC semiconductor device according to Embodiment 1 of the present invention.
Figure 6B:
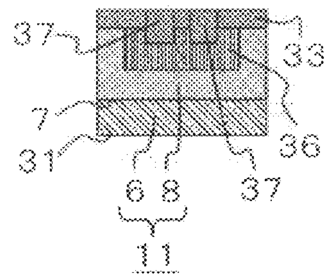

As shown in FIG. 6, the n-type dopant is next ion-implanted from the surface of the SiC drift layer 8, to form the cathode contact region 16 and the source region 37 in the surface portion of the SiC drift layer 8. As shown in FIG. 2, the cathode contact region 16 is formed so as to surround an outer circumference of the cathode region 12, resulting in the cathode contact region 16 making contact with the cathode region 12. The cathode contact region 16 and the source region 37 are of substantially the same dopant concentration, having a higher n-type concentration than the cathode region 12 and the embedded channel region 33, and are formed in one and the same ion-implantation process.

The concentration of n-type dopant for ion-implantation, which exceeds the values of dopant concentration of the first well region 13 and the second well region 36, is determined to within a value range between, for example, $1\times10^{17}$ $cm^{-3}$ and $1\times10^{21}$ $cm^{-3}$. The depth of ion-implantation is set so that the bottoms of the cathode contact region 16 and the source region 37 are at a higher position than those of the first well region 13 and the second well region 36, respectively.

By forming the cathode contact region 16 and the source region 37, a suitable ohmic contact can be made to electrodes to be formed in a later process on the cathode contact region 16 and the source region 37.

Figure 7A:
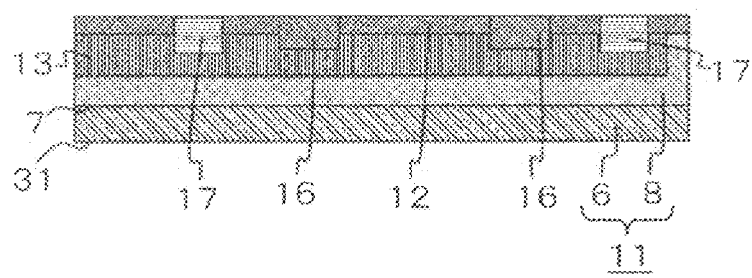
FIG. 7 is a set of cross-sectional views partially illustrating the method of fabricating the SiC semiconductor device according to Embodiment 1 of the present invention.
Figure 7B:
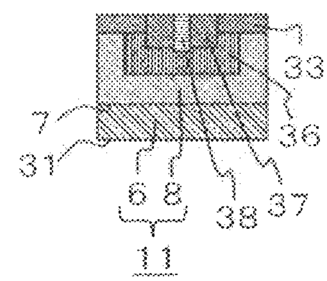

Subsequently, as shown in FIG. 7, the p-type dopant is ion-implanted from the surface of the SiC drift layer 8, to form the guard region 17 and the well contact region 38 in the surface portion of the SiC drift layer 8. As shown in FIG. 2, the guard region 17 is formed so as to surround the outer circumference of the cathode contact region 16. With this arrangement, the peripheries of the cathode region 12 and the cathode contact region 16 are surrounded, within the SiC drift layer 8, by the p-type regions of the first well region 13 and the guard region 17. The well contact region 38 is formed so as to make contact with the source region 37 and the second well region 36. The guard region 17 and the well contact region 38 are of substantially the same dopant concentration, having a higher p-type concentration than the first well region 13 and the second well region 36, and are formed in one and the same ion-implantation process.

The concentration of p-type dopant for ion-implantation, which exceeds the values of dopant concentration of the first well region 13 and the second well region 36, is determined to within a value between, for example, $1\times10^{17}$ $cm^{-3}$ and $1\times10^{21}$ $cm^{-3}$. The depth of ion-implantation is set so that the bottoms of the guard region 17 and the well contact region 36 are at a higher position than those of the first well region 13 and the second well region 36, respectively.

By forming the guard region 17 and the well contact region 38, a suitable ohmic contact can be made to electrodes that are to be formed, in a later process, on the guard region 17 and the well contact region 38, thereby allowing low resistance electrical connection of the electrodes with the first well region 13 and the second well region 36. For the process of forming the guard region 17 and the well contact region 38, preferably the ion-implantation is performed by heating the SiC epitaxial substrate 11 at 150° C. or more. With this, the guard region 17 and the well contact region 38 can be provided which have low sheet resistance.

Note that the foregoing processes of forming the cathode contact region 16 and the source region 37, and the process of forming the guard region 17 and the well contact region 38 may be performed in a reverse order.

Next, in an atmosphere of inert gas such as argon or nitrogen, alternatively in a vacuum, heat treatment is performed at a temperature within the range between 1500° C. and 2200° C., within a time range between 0.5 min. and 60 min. With this, the ion-implanted dopants are electrically activated. Note that this heat treatment may be performed with the surface of the SiC epitaxial substrate 11 covered with a carbon film. Doing this way can prevent the SiC substrate 6 and SiC drift layer 8 from having roughed surfaces, during heat treatment, caused by etching of a substance, such as residual moisture and/or residual oxygen within the device.

Next, the surface of the SiC drift layer 8 is thermally oxidized to form a sacrificial oxide film, and thereafter the sacrificial oxide film is removed by hydrofluoric acid. This allows removal of a degraded surface layer of the SiC drift layer 8, thereby providing a clear surface.

Figure 8A:
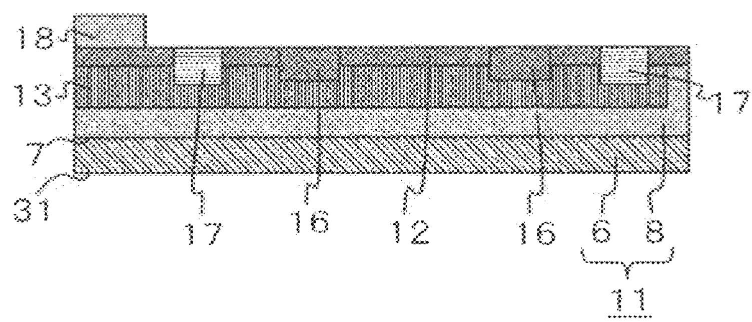
FIG. 8 is a set of cross-sectional views partially illustrating the method of fabricating the SiC semiconductor device according to Embodiment 1 of the present invention.
Figure 8B:
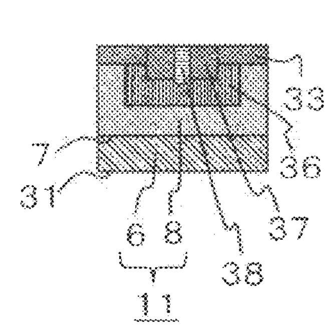

Next, the field oxide film 18 is formed on the SiC drift layer 8, as shown in FIG. 8. The field oxide film 18 is formed by depositing a silicon oxide film by a technique such as CVD and by patterning the film; however, herein, the patterning is performed so that an open portion is provided above the region, of the SiC drift layer 8, where a device is formed, and a region other than where the device is formed is covered with the field oxide film 18. It will be adequate if the field oxide film 18 has a thickness between 0.5 μm and 2 μm.

Figure 9A:
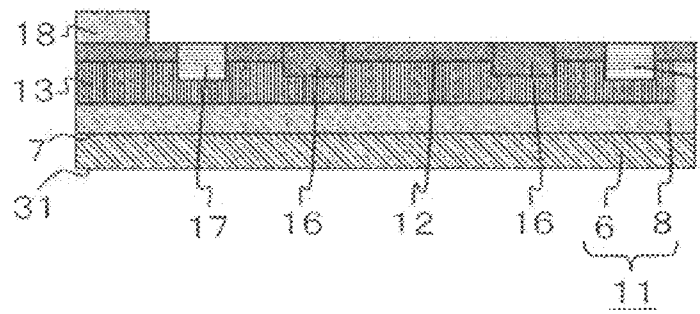
FIG. 9 is a set of cross-sectional views partially illustrating the method of fabricating the SiC semiconductor device according to Embodiment 1 of the present invention.
Figure 9B:
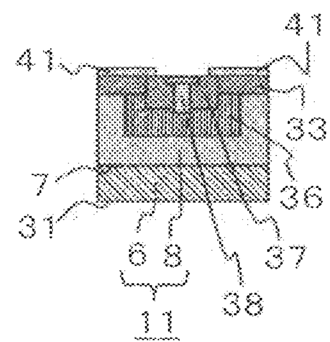

The gate dielectric film 41 is next formed above the SiC drift layer 8 of the MOSFET section 3*a*, as shown in FIG. 9. The gate dielectric film 41 is formed by forming the silicon oxide film by the thermal oxidation technique or CVD technique, and the film thickness is determined to be on the order of 50 nm.

Figure 10A:
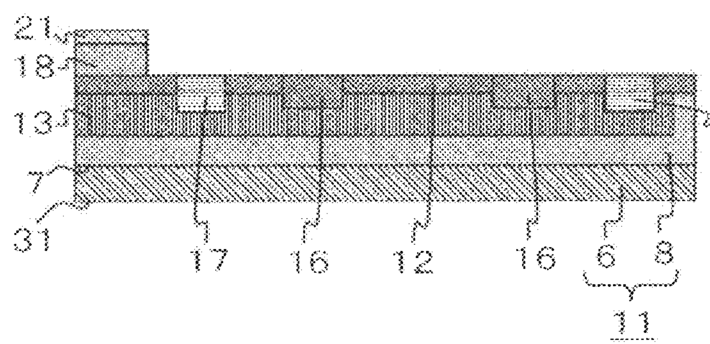
FIG. 10 is a set of cross-sectional views partially illustrating the method of fabricating the SiC semiconductor device according to Embodiment 1 of the present invention.
Figure 10B:
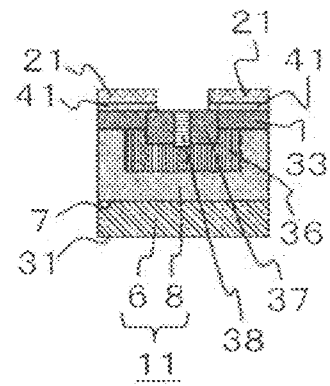

Next, the polysilicon electrode 21, serving as the gate electrode, is formed on the gate dielectric film 41 and the field oxide film 18, as shown in FIG. 10. The polysilicon electrode 21 is formed astride the source region 37, the second well region 36 and the embedded channel region 33 of the SiC drift layer 8, with the gate dielectric film 41 intervening between the polysilicon electrode 21 and the source region 37, the second well region 36 and the channel region 33. Preferably, the polysilicon electrodes 21 are of high n-type concentration.

Figures 11A, 11B:
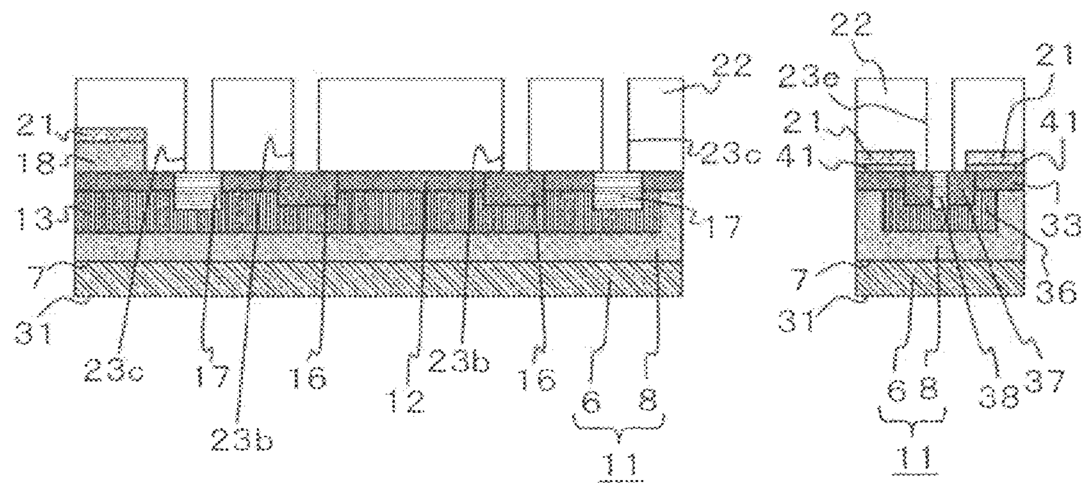
FIG. 11 is a set of cross-sectional views partially illustrating the method of fabricating the SiC semiconductor device according to Embodiment 1 of the present invention.

As shown in FIG. 11, the inter-layer dielectric film 22 is next formed on the SiC drift layer 8 and the polysilicon electrodes 21, and then, by a technique such as dry-etching, the cathode contact hole 23*b*, the guard contact hole 23*c* and the source contact hole 23*e* are formed on the cathode contact region 16, the guard region 17 and the source region 37, respectively. For the inter-layer dielectric film 22, the silicon oxide film formed by a method such as the CVD technique is employed.

Figures 12A, 12B:
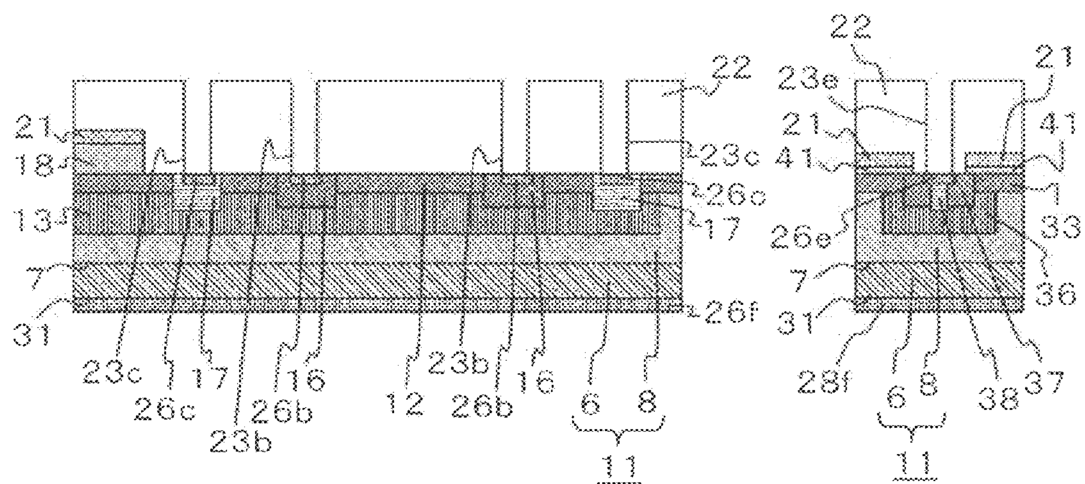
FIG. 12 is a set of cross-sectional views partially illustrating the method of fabricating the SiC semiconductor device according to Embodiment 1 of the present invention.

As shown in FIG. 12, the cathode ohmic electrode 26*b*, the guard ohmic electrode 26*c*, and the source ohmic electrode 26*e* are next formed at portions corresponding to the bottoms of the cathode contact hole 23*b* on the cathode contact region 16, the guard contact hole 23*c* on the guard region 17, and the source contact hole 23*e* on the source region 37 and the well contact region 38, respectively, and then the drain ohmic electrode 26*f* is formed on the other surface 31 of the SiC substrate 6.

For these cathode ohmic electrode 26*b*, the guard ohmic electrode 26*c*, the source ohmic electrode 26*e*, and the drain ohmic electrode 26*f*, nickel silicide is employed, for example. In a method of forming the nickel silicide, a metal film having nickel as a chief component is formed over the entire surface of substrate from above the inter-layer dielectric film 22, and likewise, the metal film having the nickel as the chief component is also formed over the other surface 31 of the SiC substrate 6, and thereafter the heat treatment is performed at 600° C. through 1100° C. Through this treatment, the nickel silicide is formed between the SiC and the metal film. Here-after, the metal film that has remained on the inter-layer dielectric film 22 is eliminated by wet-etching using a liquid mixture or the like of sulfuric acid, nitric acid, or hydrochloric acid with hydrogen peroxide water.

Note that another heat treatment may be performed after removal of the metal film that has remained on the inter-layer dielectric film 22. In this case, by performing the heat treatment at a higher temperature than that for forming the nickel silicide, an ohmic contact of lower resistance can be made.

Figures 13A, 13B:
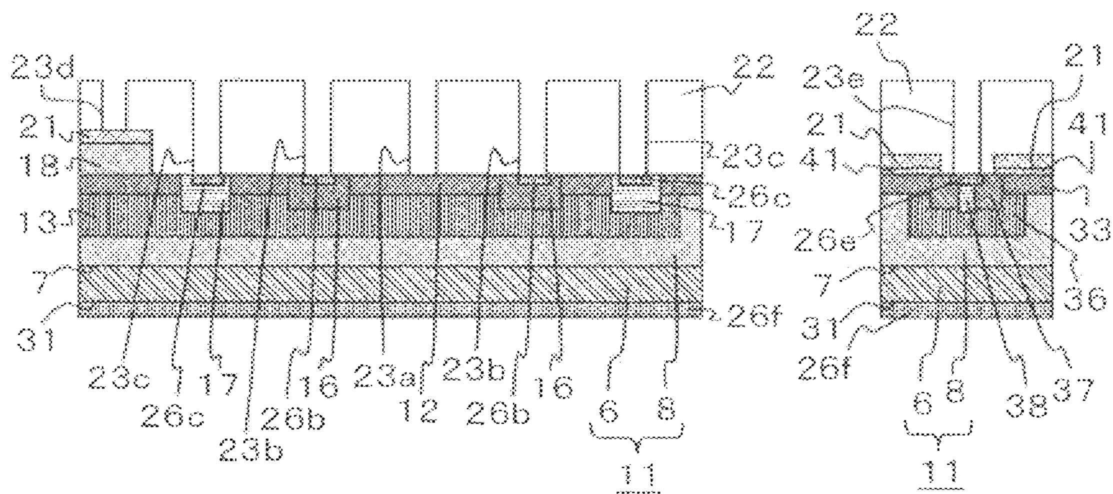
FIG. 13 is a set of cross-sectional views partially illustrating the method of fabricating the SiC semiconductor device according to Embodiment 1 of the present invention.

As shown in FIG. 13, the anode contact hole 23*a* and the gate contact hole 23*d* are next formed on the cathode region 12 and the polysilicon electrode 21, respectively. A method of forming the anode contact hole 23*a* and the gate contact hole 23*d* is as follows: First, a resist film is formed so as to cover the surface of the inter-layer dielectric film 22 except for the portions where the anode contact hole 23*a* and the gate contact hole 23*d* are to be formed, and to fill in the cathode contact hole 23*b*, the guard contact hole 23*c* and the source contact hole 23*e*; then, the respective anode contact hole 23*a* and gate contact hole 23*d* are formed by wet-etching or dry-etching; and thereafter, the resist film is removed, and degraded surface layers on the bottoms of the anode contact hole 23*a*, the cathode contact hole 23*b*, the guard contact hole 23*c*, the gate contact hole 23*d* and the source contact hole 23*e* are removed by hydrofluoric acid, spattering or the like, thereby providing a clear surface.

Note that instead of on the gate dielectric film 41, the gate contact hole 23*d* is formed on the field oxide film 18 that is thicker than the gate dielectric film 41, and this formation can prevents electrodes to be formed in a later process from making contact with the SiC drift layer 8, even in the event that the gate contact hole 23*d* penetrates the polysilicon electrode 21 during the process of forming the gate contact hole 23*d*. The gate contact hole 23*d* may be formed on the gate dielectric film 41 if the gate contact hole 23*d* is not made to penetrate the polysilicon electrode 21 during the process of forming the gate contact hole 23*d*.

Next, by spattering and depositing technique, a titanium film is formed from the surface of the inter-layer dielectric film 22. The titanium film is formed so as to make contact with the cathode region 12, the cathode ohmic electrode 26*b*, the guard ohmic electrode 26*c*, the polysilicon electrode 21 and the source ohmic electrode 26*e*, and to cover the inner surfaces of the anode contact hole 23*a*, the cathode contact hole 23*b*, the guard contact hole 23*c*, the gate contact hole 23*d* and the source contact hole 23*e*.

Next, by spattering or depositing technique, an aluminum film is formed from the surface of the titanium film. The aluminum film is formed so as to make contact with the titanium film and fill in the anode contact hole 23*a*, the cathode contact hole 23*b*, the guard contact hole 23*c*, the gate contact hole 23*d* and the source contact hole 23*e*.

Here, before forming the aluminum film, a film of metal, called barrier metal, such as a titanium nitride may be formed on the titanium film.

Then, the patterning forms the anode titanium electrode 27*a* and anode wiring 28*a*, the cathode titanium electrode 27*b* and cathode wiring 28*b*, the guard titanium electrode 27*c* and guard wiring 28*c*, the gate titanium electrode 27*d* and gate wiring 28*d*, and the source titanium electrode 27*e* and source wiring 28*e*.

By providing the anode titanium electrode 27*a* in contact with the cathode region 12, the Schottky barrier is formed between the cathode region 12 and the anode titanium electrode 27*a*, while the ohmic contact can be made between the gate titanium electrode 27*d* and the polysilicon electrode 21 serving as the gate electrode.

After the formation of the titanium film, the heat treatment may be performed at about 500° C. The heat treatment is preferably carried out for about 15 min. in an atmosphere of a gas such as argon. This allows a suitable Schottky barrier to be formed between the anode titanium electrode 27*a* and the cathode region 12, and can make an ohmic contact of lower resistance between the gate titanium electrode 27*d* and the polysilicon electrode 21.

Figures 14A, 14B:
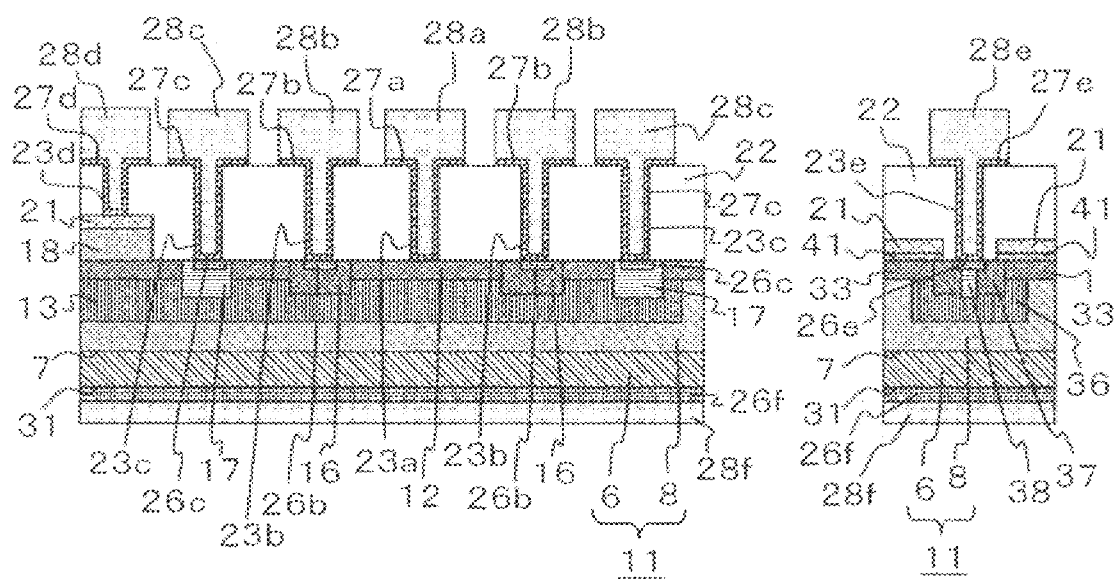
FIG. 14 is a set of cross-sectional views partially illustrating the method of fabricating the SiC semiconductor device according to Embodiment 1 of the present invention.

Next, the drain wiring 28*f* is formed on the drain ohmic electrode 26*f* using a metal such as nickel or gold, with the configuration being shown in FIG. 14.

The anode terminal 32*a*, the cathode terminal 32*b*, the guard terminal 32*c*, the gate terminal 32*d*, the source terminal 32*e* and the drain terminal 32*f* are finally formed, resulting in completion of the SiC semiconductor device 1*a* as shown in FIG. 1.

Next, referring again to FIG. 1, descriptions will be provided in terms of the operation of the SBD—acting as a temperature sensor—formed in the SBD section 2 of the SiC semiconductor device according to Embodiment 1 of the present invention.

The anode terminal 32*a* and the cathode terminal 32*b* are connected to a control integrated circuit (IC), not shown. The control IC has a built-in current source and voltmeter. This current source can supply a constant current in the forward direction of the SBD from the anode terminal 32*a* to the cathode terminal 32*b*, with a ground potential provided to the cathode terminal 32*b*. The voltmeter can measure voltage across the anode terminal 32*a* and the cathode terminal 32*b*.

First, using the current source in the control IC, a constant current of, for example, 1 μA is caused to flow from the anode terminal 32*a* to the cathode terminal 32*b*. Then, the voltmeter in the control IC measures the voltage across the anode terminal 32*a* and the cathode terminal 32*b* when the constant current flows. As the temperature of a MOSFET formed in the MOSFET section 3*a* of the SiC semiconductor device 1*a* increases, the voltage across the anode terminal 32*a* and the cathode terminal 32*b* decreases; thus, when the voltage measured becomes lower than a predetermined set-point voltage, the control IC determines that the MOSFET is in an over-temperature condition, and sends a stop signal to the MOSFET. Assuming that the set-point voltage is 0.4 V when the MOSFET is at, for example, 250° C., the control IC sends the stop signal to the MOSFET when the voltage measured becomes below 0.4 V for a certain amount of time.

In addition, when the MOSFET performs switching operations, voltages of several V and several hundred V are repeatedly applied to the drain terminal 32*f*. If the guard terminal 32*c* and the source terminal are connected together, charging/discharging current during this switching flows, though the first well region 13 and the guard region 17 that surrounds the SBD, to the guard terminal 32*c*; thus, noise due to the MOSFET switching can be suppressed from affecting the SBD.

Figure 15:
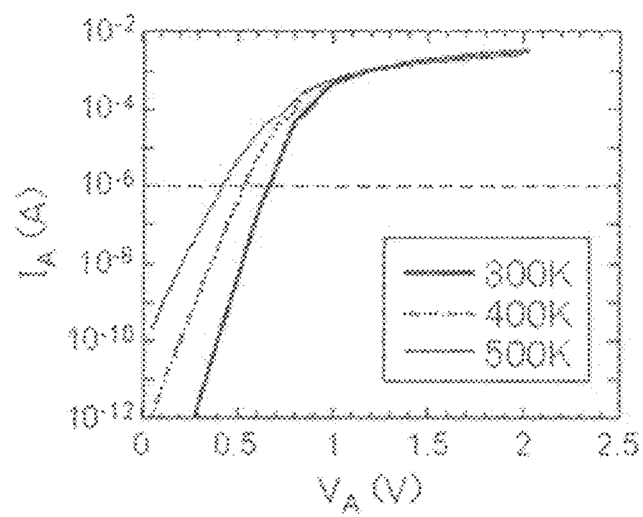
FIG. 15 shows results calculated by device simulations of current-voltage characteristics of an SBD according to Embodiment 1 of the present invention.

A specific example of the setting method according to Embodiment 1 of the present invention will be next described in terms of the set-point voltage for which the control IC determines that the MOSFET is in an over-temperature condition. FIG. 15 shows results calculated by a device simulation of current-voltage characteristic of the SBD according to Embodiment 1 of the present invention. Referring to FIG. 15, the horizontal axis represents voltage of the anode terminal 32*a* (anode voltage $V_A$), while the vertical axis represents current that flows through the anode terminal 32*a* (anode current $I_A$), that is, current that flows through the SBD. In this case, the simulation was performed for temperatures T of the SBD, that is, the MOSFET temperatures T of 300K, 400K and 500K. In FIG. 15, a bold solid line indicates the results for T=300K; dotted lines, for T=400K; and a narrow solid line, for T=500K. Note that the ground potential is provided to the cathode terminal 32*b* and a dopant concentration of the cathode region 12 is set to $1\times10^{17}$ $cm^{-3}$.

It is assumed herein that, using the control IC current source, a constant current (current for determination) of 1 μA is flowed from the anode terminal 32*a* to the cathode terminal 32*b*, i.e., that the anode current $I_A$ is 1 μA. In FIG. 15, the broken lines indicate the current level where the anode current $I_A$, i.e., the determination current is 1 μA.

Figure 16:
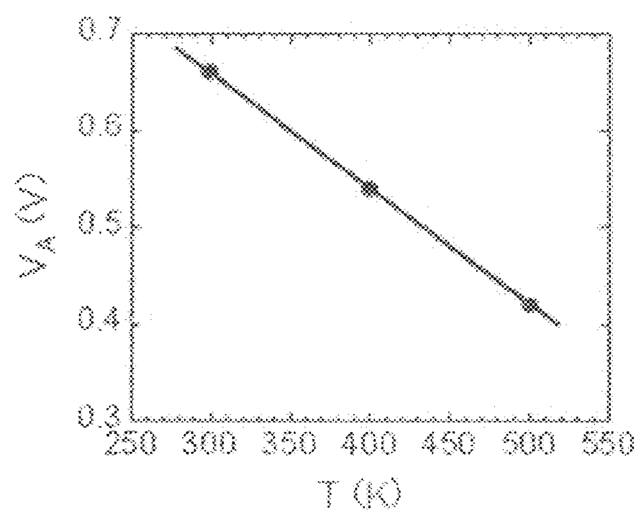
FIG. 16 is a graph showing a relationship between a temperature T of the SBD and an anode voltage $V_A$ for an anode current $I_A$ of 1 micro A.

FIG. 16 is a graph showing a relationship between the SBD temperature T and the anode voltage $V_A$, for the anode current $I_A$ of 1 μA. Referring to FIG. 16, the horizontal axis represents the SBD temperature T, and the vertical axis, the anode voltage $V_A$. Points marked in FIG. 16 represent those where the anode current $I_A$ is 1 μA in FIG. 15.

FIG. 16 shows that when the SBD temperature T, i.e., the MOSFET temperature T is 523K (250° C.), the anode voltage $V_A$ is 0.4 V. Therefore, as described previously, in order to prevent the MOSFET temperature T from exceeding 250° C., it will be adequate if the set-point temperature in the control IC, when the determination current is 1 μA, is set at a value corresponding to 0.4 V and the anode voltage $V_A$ is measured, and when this voltage measured is below 0.4 V for a certain amount of time, the control IC sends the stop signal to the MOSFET.

In this way, by checking the relationship between the voltage across the anode terminal 32*a* and the cathode terminal 32*b* (anode voltage $V_A$) and the current that flows through the SBD (anode current $I_A$) —i.e., the SBD current—voltage characteristic—the anode voltage $V_A$ (0.4 V in this case) can be derived which corresponds to the set-point temperature (here, set at 523K (250° C.)) at which the control IC is to stop the MOSFET operation. And the anode voltage $V_A$ derived is set as the set-point voltage, thereby enabling the MOSFET to be protected from becoming an over-temperature condition.

In this case, the results of simulations for the SBD temperatures of 300K, 400K and 500K were plotted in FIG. 16, and the anode voltage $V_A$ was found to be 0.4 V from FIG. 16 and the set-point voltage was thereby determined to be 0.4 V. However, the simulations may be initially performed for the temperature T of 523K (250° C.), to determine the set-point voltage from the results.

Further, in this case, the SBD current—voltage characteristic was found by the simulations, and the results were used to determine the set-point voltage for which the control IC determines that the MOSFET is in the over-temperature condition; however, the set-point voltage may be determined based on the results obtained when the SBD current—voltage characteristic is actually measured instead of the simulations.

In Embodiment 1 according to the present invention, an advantageous effect is that the foregoing configuration can provide the SiC semiconductor device 1*a* that is equipped with the SBD for measuring a MOSFET temperature.

Further, the gate dielectric film 41 and the polysilicon electrode 21 are provided and the gate titanium electrode 27*d* is provided on the polysilicon electrode 21, thereby allowing for formation of the anode titanium electrode 27*a*—the Schottky electrode—and the gate titanium electrode 27*d* in the same process. Forming these in the same process allows reduction of a dedicated process for fabricating the SBD section 2 of the SiC semiconductor device 1*a*, resulting in improved productivity.

Moreover, providing the source region 37, the source ohmic electrode 26*e* and the second well region 36 allows formation of the source region 37 and the cathode contact region 16 in the same process, formation of the source ohmic electrode 26*e* and the cathode ohmic electrode 26*b* in the same process, and formation of the second well region 36 and the first well region 13 in the same process. Forming these in the same process allows further reduction of the dedicated process for fabricating the SBD section 2 of the SiC semiconductor device 1*a*, resulting in improved productivity.

Providing the guard region 17, the guard ohmic electrode 26*c* and the well contact region 38 allows formation of the guard region 17 and the well contact region 38 in the same process and formation of the guard ohmic electrode 26*c*, the cathode ohmic electrode 26*b* and source ohmic electrode 26*e* in the same process. Forming these in the same process allows further reduction of the dedicated process for fabricating the SBD section 2 of the SiC semiconductor device 1*a*, resulting in improved productivity. In addition, providing the guard region 17 allows suppression of the switching noise from affecting the SBD.

By connecting the control IC, which includes the current source and the voltmeter, across the anode terminal 32*a* and the cathode terminal 32*b*, the temperature of MOSFET can easily be measured and thereby the over-temperature of MOSFET can be detected.

In Embodiment 1 according to the present invention, the cathode region 12 and the embedded channel region 33 are formed in the surface portion of the SiC drift layer 8. However, without in particular forming the cathode region 12 and the embedded channel region 33, the surface portion of the SiC drift layer 8 per se may be used as the cathode region 12 and the embedded channel region 33.

Further, in Embodiment 1 according to the present invention, the MOSFET serves as an SiC semiconductor element whose temperature is measured using the SBD; however, the element is not limited to the MOSFET, but an element such as an insulated gate bipolar transistor (IGBT), a junction FET (JFET), or a static induction transistor (SIT) may serve as the SiC semiconductor element. The MOSFET can achieve commonality of the processes of fabricating the SBD and the MOSFET, thus leading to increased productivity.

Embodiment 2

FIG. 17 is a set of cross-sectional views illustrating a SiC semiconductor device 1*b* according to Embodiment 2 of the present invention; FIG. 17A is a cross-sectional view illustrating a neighborhood of a pn junction diode section 42 and FIG. 17B is a cross-sectional view illustrating a MOSFET section 3*b*. In FIG. 17, those labeled with the same reference numerals as in FIG. 1 represent the same or corresponding configurations, and their descriptions will not be provided herein. A difference between Embodiment 1 and the present embodiment according to the present invention is a configuration in which the SBD is not applied to a diode that serves as the temperature sensor for the MOSFET, but the pn junction diode is applied thereto. Another difference is a configuration in which there is not provided the embedded channel region 33 in the surface portion of the SiC drift layer 8.

In FIG. 17, the SiC semiconductor device 1*b* includes the MOSFET where a MOSFET, which is the SiC semiconductor element, is formed on the SiC epitaxial substrate 11, and the pn junction diode section 42 where a pn junction diode is formed.

The configuration of the pn junction diode section 42 will be described first. Referring to FIG. 17A, the pn junction diode section 42 has a shallow n-type well region 43, serving as the cathode region, formed in the surface portion of the SiC drift layer 8, and a deep p-type well region 46 formed in contact with and in a portion deeper than the shallow well 43.

Further, a third p-type well region 47 is formed in the surface portion of the SiC drift layer 8 so as to surround and partially overlap outer circumferences of the shallow well region 43 and the deep well region 46. Then, a p-type anode region 48 of higher concentration than the third well region 47 is formed in the surface portion of the shallow well region 43 of the SiC drift layer 8, and the n-type cathode contact region 16 of higher concentration than the shallow well region 43 is formed in the surface portion so as to surround an outer circumference of the anode region 48. In addition, the p-type guard region 17 of higher concentration than the third well region 47 is formed in the surface portion of the third well region 47 of the SiC drift layer 8 so as to surround an outer circumference of the cathode contact region 16.

The inter-layer dielectric film 22 is formed on the SiC drift layer 8 and the polysilicon electrode 21, and the anode contact hole 23*a*, the cathode contact hole 23*b*, the guard contact hole 23*c* and the gate contact hole 23*d* are formed on the anode region 48, the cathode contact region 16, the guard region 17 and the polysilicon electrode 21, respectively.

Then, the anode ohmic electrode 26*a*, the cathode ohmic electrode 26*b* and the guard ohmic electrode 26*c* are formed in portions corresponding to the bottoms of the anode contact hole 23*a* on the anode region 48, of the cathode contact hole 23*b* on the cathode contact region 16, and of the guard contact hole 23*c* on the guard region 17, respectively.

Moreover, the anode titanium electrode 27*a* is formed so as to make contact with the anode ohmic electrode 26*a* and cover the inner surface of the anode contact hole 23*a*. Since other titanium electrodes, various wiring traces formed on the titanium electrodes, the drain ohmic electrode 26*f*, the drain wiring 28*f* and various terminals are the same as those in Embodiment 1, their descriptions will not be provided herein.

The configuration of the MOSFET section 3*b* will be described next. As shown in FIG. 17B, in the MOSFET section 3*b*, the second p-type well region 36 of substantially the same concentration as the third well region 47 is formed in the surface portion of the SiC drift layer 8; the n-type source region 37 of substantially the same concentration as the cathode contact region 16 is formed in the surface portion of the second well region 36 of the SiC drift layer 8; and the p-type well contact region 38 of the same concentration as the anode region 48 and the guard region 17 is formed in the surface portion of the SiC drift layer 8 so as to make contact with the source region 37 and the second well region 36.

The polysilicon electrode 21 is formed astride the source region 37 and the second well region 36, of the SiC drift layer 8, with the gate dielectric film 41 intervening between the polysilicon electrode and the source region 37 and the second well region 36. Note that the inter-layer dielectric film 22, the source contact hole 23*e*, other electrodes and the like are the same as those in Embodiment 1 of the present invention and thus their descriptions will not be provided herein.

A method of fabricating the SiC semiconductor device 1*b* according to Embodiment 2 of the present invention will be described next. FIGS. 18 through 25 are cross-sectional views partially illustrating the method of fabricating the SiC semiconductor device according to Embodiment 2 of the present invention. Note that, in each of the drawing numbers, the symbol A depicts the pn junction diode section 42 and its neighborhood, and the symbol B, the MOSFET section 3*b*.

As shown in FIG. 18, the n-type SiC drift region 8 is first formed on the surface 7 of the n-type SiC substrate 6 and thereafter, by ion implantation, the deep p-type well region 46 and the shallow n-type well region 43 serving as the cathode region is formed at one and the same time. The depth of the shallow well region 43 is set to within a value of 0.6 μm, for example. The bottom of the deep well region 46 is determined to be deeper than that of the shallow well region 43, and to be deeper than those of the second well region 36 and the third well region 47, which are formed in a subsequent process.

Here, the n-type dopant concentration of the SiC drift layer 8 is set to within a value between $1\times10^{14}$ cm$^{-3}$ and $1\times10^{17}$ cm$^{-3}$, for example. In addition, the dopant concentrations of the shallow well region 43 and the deep well region 46 are set to be values that exceed a value of the dopant concentration of the SiC drift layer 8 and that do not exceed those of the dopant concentrations of the second well region 36 and the third well region 47, which are formed in a subsequent process.

As shown in FIG. 19, a p-type dopant is ion-implanted, to form the third well region 47 and the second well region 36 in the surface portion of the SiC drift layer 8. The third well region 47 is formed so as to partially overlap with the shallow well region 43 and the deep well region 46, and to surround outer circumferences of the shallow well region 43 and the deep well region 46. The bottom of the third region 47 is determined to be deeper than that of the shallow well region 43, and to be shallower than that of the deep well region 46. The third well region 47 and the second well region 36 have substantially the same dopant concentration, and are formed by ion implantation at one and the same time. The p-type dopant concentration for ion implantation, which exceeds a value of dopant concentration of the SiC drift layer 8, is determined to within a value range between $1\times10^{15}$ cm$^{-3}$ and $1\times10^{19}$ cm$^{-3}$, for example.

As shown in FIG. 20, an n-type dopant is next ion-implanted to form the cathode contact region 16 in the surface portion of the shallow well region 43 of the SiC drift layer 8, and the source region 37 in the surface portion of the second well region 36. The cathode contact region 16 and the source region 37, which have substantially the same dopant concentration of a higher n-type concentration than the shallow well region 43, are formed by ion implantation at one and the same time. The n-type dopant concentration for ion-implantation, which exceeds values of the dopant concentrations of the first well region 13 and the second well region 36, is determined to within a value range between $1\times10^{17}$ cm$^{-3}$ and $1\times10^{21}$ cm$^{-3}$, for example.

Figure 21A:
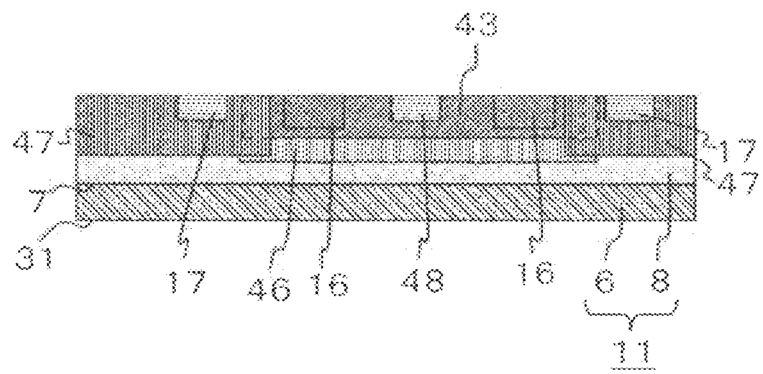
FIG. 21 is a set of cross-sectional views partially illustrating the method of fabricating the SiC semiconductor device according to Embodiment 2 of the present invention.
Figure 21B:
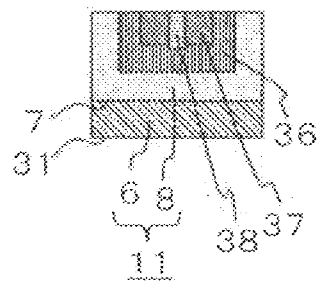

As shown in FIG. 21, a p-type dopant is next ion-implanted to thereby form the anode region 48 in the surface portion of the shallow well region 43 of the SiC drift layer 8, the guard region 17 in the surface portion of the third well region 47, and the well contact region 38 in the surface portion of the second well region 36. The anode region 48 is disposed so that the cathode contact region 16 surrounds the outer circumference of the anode region. The anode region 48, the guard region 17 and the well contact region 38, which have substantially the same dopant concentrations of p-type having a higher concentration than the third well region 47 and the second well region 36, are formed by ion implantation at one and the same time. The bottoms of the anode region 48, the guard region 17 and the well contact region 38 are set so as to be at a higher position than that of the shallow well region 43; their dopant concentrations are determined to within value ranges between $1\times10^{17}$ cm$^{-3}$ and $1\times10^{21}$ cm$^{-3}$, for example.

Next, in an atmosphere of inert gas such as argon or nitrogen, alternatively in a vacuum, the heat treatment is performed at a temperature within the range between 1500° C. and 2200° C., within a time range between 0.5 min. and 60 min. With this treatment, the ion-implanted dopants are electrically activated.

Figure 22A:
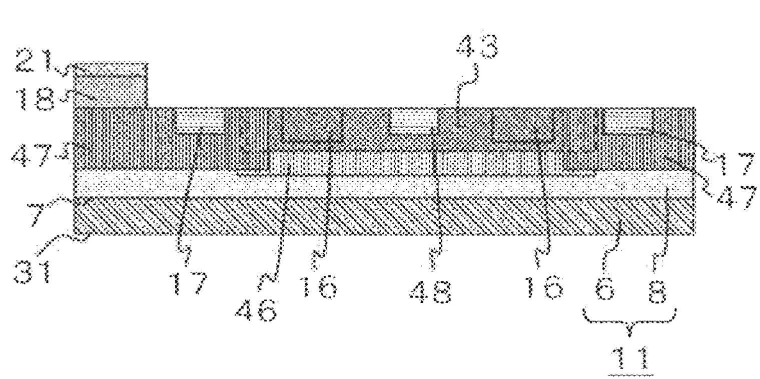
FIG. 22 is a set of cross-sectional views partially illustrating the method of fabricating the SiC semiconductor device according to Embodiment 2 of the present invention.
Figure 22B:
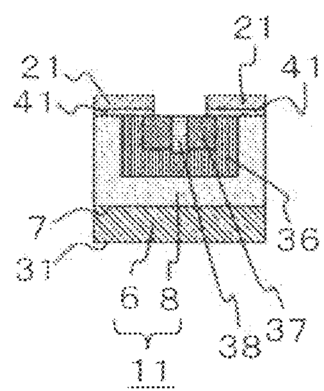

Next, the field oxide film 18 is formed and the gate dielectric film 41 is formed, as shown in FIG. 22. Then, the polysilicon electrode 21 is formed on the gate dielectric film 41 and the field oxide film 18. The polysilicon electrode 21 is formed astride the source region 37 and the second well region 36 of the SiC drift layer 8, with the gate dielectric film 41 intervening between the polysilicon electrode 21 and the source region 37 and the second well region 36.

As shown in FIG. 23, the inter-layer dielectric film 22 is next formed on the SiC drift layer 8 and the polysilicon electrodes 21, and by a technique such as dry-etching, the anode contact hole 23*a*, cathode contact hole 23*b*, the guard contact hole 23*c* and the source contact hole 23*e* are formed on the anode region 48, the cathode contact region 16, the guard region 17 and the source region 37, respectively. Then, formed in portions corresponding to the bottoms of the respective contact holes are the anode ohmic electrode 26*a*, the cathode ohmic electrode 26*b*, the guard ohmic electrode 26*c* and the source ohmic electrode 26*e*. And the drain ohmic electrode 26*f* is formed on the other surface 31 of the SiC substrate 6.

The gate contact hole 23*d* is next formed on the polysilicon electrode 21, as shown in FIG. 24.

Subsequently, a titanium film is formed from the surface of the inter-layer dielectric film 22. The titanium film is formed so as to cover the inner surfaces of the anode contact hole 23*a*, the cathode contact hole 23*b*, the guard contact hole 23*c*, the gate contact hole 23*d* and the source contact hole 23*e*.

Next, an aluminum film is formed from the surface of the titanium film. The aluminum film is formed so as to fill in the anode contact hole 23*a*, the cathode contact hole 23*b*, the guard contact hole 23*c*, the gate contact hole 23*d* and the source contact hole 23*e*.

Then, formed by patterning are the anode titanium electrode 27*a* and anode wiring 28*a*, the cathode titanium electrode 27*b* and cathode wiring 28*b*, the guard titanium electrode 27*c* and guard wiring 28*c*, the gate titanium electrode 27*d* and gate wiring 28*d*, and the source titanium electrode 27*e* and source wiring 28*e*.

Figures 25A, 25B:
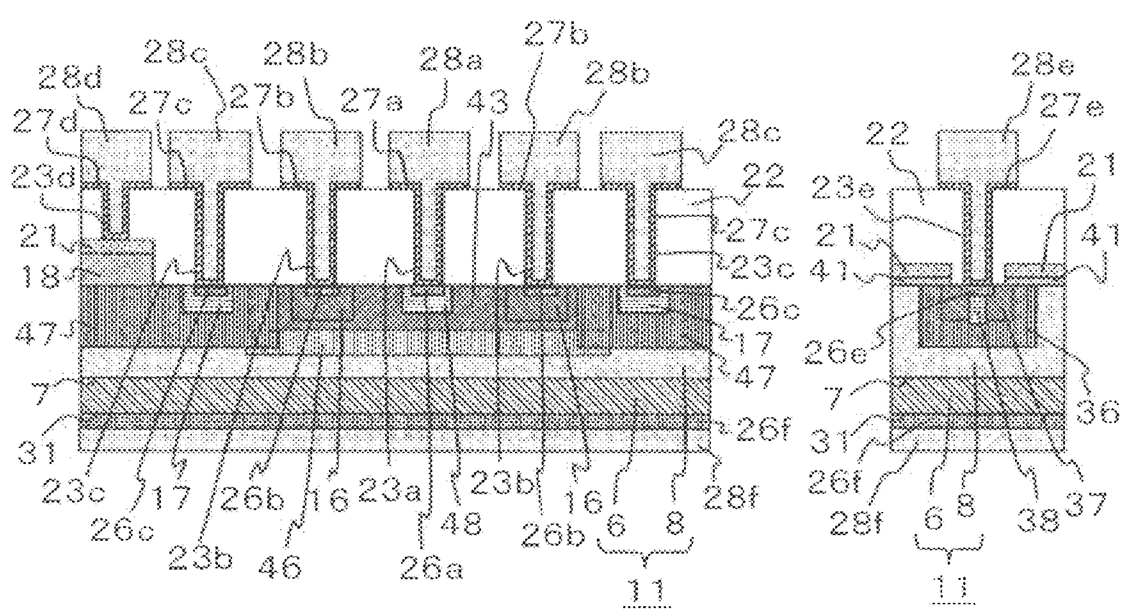
FIG. 25 is a set of cross-sectional views partially illustrating the method of fabricating the SiC semiconductor device according to Embodiment 2 of the present invention.

Next, the drain wiring 28*f* is formed on the drain ohmic electrode 26*f* using a metal such as nickel or gold, with the configuration being shown in FIG. 25.

The anode terminal 32*a*, the cathode terminal 32*b*, the guard terminal 32*c*, the gate terminal 32*d*, the source terminal 32*e* and the drain terminal 32*f* are finally formed, resulting in completion of the SiC semiconductor device 1*b* as shown in FIG. 17.

The operation of the pn junction diode serving as the temperature sensor, formed in the SiC semiconductor device 1*b* according to Embodiment 2 of the present invention will not be provided herein because of being the same as that in Embodiment 1 thereof.

In Embodiment 2 according to the present invention, an advantageous effect of the configuration described above is that the SiC semiconductor device 1*b* can be provided that is equipped with the pn junction diode for measuring the temperature of the MOSFET.

In addition, the shallow well region 43, serving as the cathode region, and the deep well region 46 can be formed in the one and same process. Forming these regions in the same process allows reduction of the fabrication process of the SiC semiconductor device 1*b*, thereby improving the productivity.

The anode region 48, the guard region 17 and the well contact region 38 can be formed in one and the same process. Forming these regions in the same process allows reduction of a dedicated process for fabricating the pn junction diode section 42 of the SiC semiconductor device 1*b*, thereby improving the productivity.

Further, the anode ohmic electrode 26*a*, the cathode ohmic electrode 26*b*, the guard ohmic electrode 26*c* and the source ohmic electrode 26*e* are formed in one and the same process. Forming these in one and the same process allows further reduction of the dedicated process for fabricating the pn junction diode section 42 of the SiC semiconductor device 1*b*, thereby improving the productivity.

By connecting the control IC, which includes the current source and the voltmeter, across the anode terminal 32*a* and the cathode terminal 32*b*, the temperature of MOSFET can easily be measured, thus detecting the over-temperature of MOSFET.

Note that, for Embodiment 2 of the present invention, the difference from Embodiment 1 thereof has been described, and descriptions of the same or the corresponding portions have not been provided.

Reference Numerals

1*a*, 1*b* SiC semiconductor device
2 SBD section
3*a*, 3*b* MOSFET section
6 N-type SiC substrate
7 Surface of SiC substrate
8 N-type SiC drift layer
11 SiC epitaxial substrate
12 N-type cathode region
13 First p-type well region
16 N-type cathode contact region of high dopant concentration
17 P-type guard region of high dopant concentration
21 Polysilicon electrode
26*b* Cathode ohmic electrode
26*c* Guard ohmic electrode
26*e* Source ohmic electrode
27*a* Anode titanium electrode
27*d* Gate titanium electrode
31 Other surface of SiC substrate
36 Second p-type well region
37 N-type source region of high dopant concentration
37 P-type well contact region of high dopant concentration
41 Gate dielectric film

The invention claimed is:

1. A silicon carbide semiconductor device, comprising:

a silicon carbide epitaxial substrate having an n-type silicon carbide substrate, and an n-type silicon carbide drift layer formed on a surface of the silicon carbide substrate;

a silicon carbide semiconductor element formed on the silicon carbide epitaxial substrate; and a Schottky diode formed on the silicon carbide epitaxial substrate, for measuring a temperature of the silicon carbide semiconductor element, the Schottky diode including an n-type cathode region in a surface portion of the silicon carbide drift layer, a first titanium electrode formed on the cathode region, the first titanium electrode serving as a Schottky electrode, an n-type cathode contact region formed in the surface portion of the silicon carbide drift layer so as to make contact with the cathode region, the cathode contact region having a higher concentration than the cathode region, a first ohmic electrode formed on the cathode contact region, a second titanium electrode formed on the first ohmic electrode, and a first p-type well region formed so as to surround peripheries of the cathode region and the cathode contact region within the silicon carbide drift layer, the silicon carbide semiconductor element including an n-type channel region in the surface portion of the silicon carbide drift layer, the channel region having the same concentration as the cathode region, a second p-type well region formed in contact with, and in a portion deeper than, the channel region of the silicon carbide drift layer, the second well region having the same concentration as the first well region, an n-type source region formed so as to range, in the surface portion of the silicon carbide drift laver, from the channel region to the second well region, the source region having the same concentration as the cathode contact region, a second ohmic electrode formed on the source region, a third titanium electrode formed on the second ohmic electrode, and a gate dielectric film formed on the silicon carbide drift layer, a polysilicon electrode formed on the gate dielectric film and above the second well region, with the gate dielectric film and the channel region intervening between the polysilicon electrode and the second well region, the polysilicon electrode serving as a gate electrode, and a fourth titanium electrode formed on the polysilicon electrode.

2. The silicon carbide semiconductor device of claim 1, wherein the first well region has a low concentration region formed in a portion deeper than the cathode region and the cathode contact region in the silicon carbide drift layer; and a p-type guard region formed in contact with the low concentration region, in the surface portion of the silicon carbide drift layer, the guard region having a higher concentration than the low concentration region, wherein the Schottky diode includes a third ohmic electrode formed on the guard region, wherein the silicon carbide semiconductor element includes a p-type well contact region formed in the surface portion of the silicon carbide drift layer so as to make contact with the source region and the second well region, the well contact region having substantially the same concentration as the guard region, and wherein the second ohmic electrode is formed also on the well contact region.

3. The silicon carbide semiconductor device of claim 1, wherein the Schottky diode and silicon carbide semiconductor element include an inter-layer dielectric film on the silicon carbide drift layer and the polysilicon electrode, the inter-layer dielectric film having an anode contact hole formed so that the cathode region is partially exposed, and a gate contact hole formed so that the polysilicon electrode is partially exposed, and wherein the first titanium electrode is formed on the bottom of the anode contact hole, and the fourth titanium electrode is formed on the bottom of the gate contact hole.

4. The silicon carbide semiconductor device of claim 3, wherein an inter-layer dielectric film includes a cathode contact hole formed so that the cathode contact region is exposed, and a source contact hole formed so that the source region is exposed, and wherein the first ohmic electrode is formed on the bottom of the cathode contact hole and the second ohmic electrode is formed on the bottom of the source contact hole.

5. The silicon carbide semiconductor device of claim 3, wherein the first well region has a low concentration region formed in a portion deeper than the cathode region and the cathode contact region in the silicon carbide drift layer; and a p-type guard region formed in contact with the low concentration region, in the surface portion of the silicon carbide drift layer, the guard region having a higher concentration than the low concentration region, wherein the Schottky diode includes a third ohmic electrode formed on the guard region, wherein the silicon carbide semiconductor element includes a p-type well contact region formed in the surface portion of the silicon carbide drift layer so as to make contact with the source region and the second well region, the well contact region having the same concentration as the guard region, and wherein the second ohmic electrode is formed also on the well contact region.

6. The silicon carbide semiconductor device of claim 4, wherein the first well region has a low concentration region formed in a portion deeper than the cathode region and the cathode contact region in the silicon carbide drift layer; and a p-type guard region formed in contact with the low concentration region, in the surface portion of the silicon carbide drift layer, the guard region having a higher concentration than the low concentration region, wherein the Schottky diode includes a third ohmic electrode formed on the guard region, wherein the silicon carbide semiconductor element includes a p-type well contact region formed in the surface portion of the silicon carbide drift layer so as to make contact with the source region and the second well region, the well contact region having the same concentration as the guard region, and wherein the second ohmic electrode is formed also on the well contact region.

* * * * *